United States Patent
Schnitt et al.

(10) Patent No.: US 7,332,778 B2
(45) Date of Patent: Feb. 19, 2008

(54) SEMICONDUCTOR DEVICE AND METHOD OF MANUFACTURING SAME

(76) Inventors: Wolfgang Schnitt, Alstersteig 21, 22851 Norderstedt (DE); Hauke Pohlmann, Paulsenplatz 12, 22767 Hamburg (DE)

( * ) Notice: Subject to any disclaimer, the term of this patent is extended or adjusted under 35 U.S.C. 154(b) by 92 days.

(21) Appl. No.: 10/516,713

(22) PCT Filed: Jun. 2, 2003

(86) PCT No.: PCT/IB03/02084

§ 371 (c)(1),
(2), (4) Date: Dec. 1, 2004

(87) PCT Pub. No.: WO03/103041

PCT Pub. Date: Dec. 11, 2003

(65) Prior Publication Data

US 2006/0068530 A1    Mar. 30, 2006

(30) Foreign Application Priority Data

Jun. 4, 2002 (DE) ............................... 102 24 615

(51) Int. Cl.
*H01L 23/62* (2006.01)
(52) U.S. Cl. .................. 257/355; 257/361; 257/362; 257/367; 257/511; 257/E29.182; 257/E29.184; 257/E29.187
(58) Field of Classification Search .............. 257/409, 257/401, 488, 507, 508, 347, 350, 353, 327, 257/262, E27.112, E27.113, E29.009, E29.01, 257/E29.015, E29.017, 351, 526, E29.182, 257/E29.184
See application file for complete search history.

(56) References Cited

U.S. PATENT DOCUMENTS 5,198,379 A * 3/1993 Adan .......................... 438/151
5,886,364 A * 3/1999 Zhang .......................... 257/53

* cited by examiner

*Primary Examiner*—Minhloan Tran
*Assistant Examiner*—Benjamin Tzu-Hung Liu
(74) *Attorney, Agent, or Firm*—Peter Zawilski

(57) ABSTRACT

To refine a semiconductor device (100), in particular a S[ilicon]O[n]I[nsulator] device, comprising:
 at least one isolating layer (10) made of a dielectric material;
 at least one silicon substrate (20) arranged on said isolating layer (10);
 at least one component (30) integrated in the silicon substrate (20), which component has at least one slightly doped zone (34); as well as
 at least a first, in particular planar, metallization region (40) arranged between the isolating layer (10) and the component (30), in particular between the isolating layer (10) and the slightly doped zone (34) of the component (30), as well as a method of manufacturing at least one semiconductor device (100) in such a manner that trouble-free operation also of slightly doped components (30), such as pnp transistors, is guaranteed in a SOI process transferred onto the insulator, it is proposed that at least a second, in particular planar, metallization region (42) is arranged on the side of the silicon substrate (20) facing away from the isolating layer (10), in the area of the component (30), particularly in the area of the slightly doped zone (34) of the component (30).

6 Claims, 1 Drawing Sheet

SEMICONDUCTOR DEVICE AND METHOD OF MANUFACTURING SAME

Figure 1:
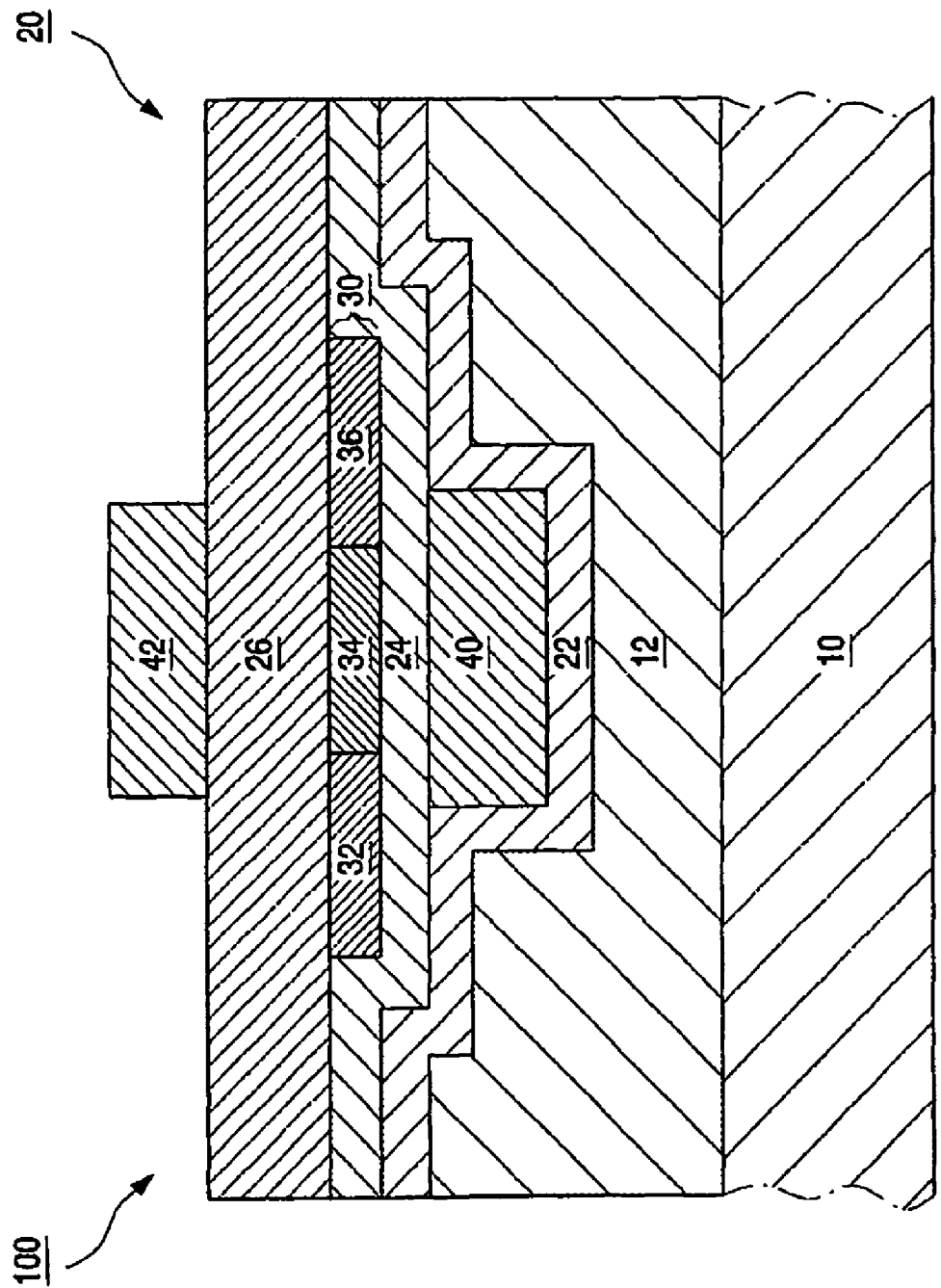

The invention relates generally to the realm of semiconductor technology, in particular in connection with so-termed S[ilicon]O[n]I[nsulator] material.

The invention particularly relates to a semiconductor device in accordance with the pre-characterizing part of claim 1 and to a method of manufacturing at least one semiconductor device in accordance with the pre-characterizing part of claim 6.

If components having slightly doped zones are employed, such as in the case of bipolar pnp transistors with an n-doped region, care should be taken that, in respect of the potential of this slightly doped region, a potential difference that exceeds the threshold voltage and causes the conductivity type of the slightly doped region to change (=the so-termed inversion process) does not take place. Above said threshold voltage a conductive channel forms, in this example a p-channel in the base of the bipolar pnp transistor, which short-circuits the two highly doped regions with each other, in this example the emitter and the collector of the bipolar pnp transistor, and causes the component to malfunction.

In the case of a conventional construction (=so-termed bulk-silicon technology) of such components in silicon, such a malfunction is precluded in that a field plate is arranged over the component with the slightly doped region, the potential of said field plate corresponding to that of said region. In most cases, the wiring levels of the components are themselves used to establish the potential ratios. As a result, the potential differences (→voltages) that occur are always smaller than the threshold voltage at which a conductive channel forms.

In this connection, reference can be made to, for example, U.S. Pat. No. 6,190,948 B1 wherein a semiconductor device comprising a pnp transistor, an oxide layer, a first field plate and a further field plate is disclosed; as regards the technological background pertinent to this, reference is additionally made to the documents U.S. Pat. No. 5,420,457, U.S. Pat. No. 5,440,161, U.S. Pat. No. 5,731,627, U.S. Pat. No. 5,973,341 and U.S. Pat. No. 6,118,154.

It should be borne in mind that in recent times in the realm of semiconductor technology more and more so-termed S[ilicon]O[n]I[nsulator] processes are being applied (for this technical field see, for example, DE 197 55 135 C1); in such a SOI process that is transferred onto an insulator, the conductive silicon substrate is replaced with an insulator. Said SOI-technology reduces effects brought about by internal parasitic capacitances and transistors in the silicon; such undesirable effects hamper the further miniaturization of integrated circuits.

Basically, the SOI process technology is a method of isolating millions of tiny transistors on a computer chip so as to achieve a more efficient use of energy. A reduction of energy losses enables the computing power of, for example, high-end computers to be substantially increased. SOI employs a buried oxide layer to achieve complete dielectric isolation of each one of the components of an integrated circuit.

It must be borne in mind, however, that when the SOI technology is applied, the potential ratios on one side of the component are undefined since the use of the conventionally employed wiring levels as described in the opening paragraph precludes the formation of a conductive channel on one side of the component only. Accordingly, when a SOI process transferred onto an insulator is being tested, malfunctions of lateral pnp transistors can be observed which are triggered by electrostatic charging of the synthetic resin packaging of components to be tested.

Based upon the drawbacks and deficiencies set forth hereinabove and on an assessment of the outlined state of the art, it is an object of the present invention to refine a semiconductor device of the type mentioned in the opening paragraph as well as a method of the type mentioned in the opening paragraph in such a manner that trouble-free operation also of slightly doped components, such as pnp transistors, is ensured in a SOI process transferred onto an insulator.

This object is achieved by a semiconductor device whose features are indicated in claim 1, as well as by a method whose features are indicated in claim 6. Advantageous embodiments and appropriate refinements of the invention in question are specified in the relevant sub-claims.

The theory underlying the present invention is therefore based on the introduction of at least one new additional metallization level, for example in the form of at least one field plate, after the transfer of the SOI process onto the insulator. This field plate in the additional metallization level can be appropriately used as a wiring level of the component itself and enables the potential ratios on both sides of the component to be established and hence trouble-free operation of the component and of the related integrated circuit.

As regards the present invention, persons skilled in the art will particularly appreciate that the metallization applied after the transfer of the SOI process onto the insulator layer can be advantageously used as an additional or second electrode to electrically shield the at least one slightly doped component on both sides. By virtue thereof, a trouble-free operation, also of the slightly doped components, in particular of vertical transistors with pa junctions or np junctions, is guaranteed in the SOI process transferred onto the insulator.

Accordingly, the present invention finally relates to the use of at least a first, in particular planar, metallization region (="first field plate") as well as at least a second, in particular planar, metallization region (="second field plate") to electrically shield at least one component, on both sides, which is integrated in the silicon substrate of a S[ilicon]O[n]I[[nsulator] device of the type described hereinabove, and in particular to electrically shield, on both sides, at least one slightly doped zone of the component.

Therefore, the semiconductor device in accordance with the invention as well as the method of manufacturing at least one semiconductor device in accordance with the invention and also the application in accordance with the invention advantageously and reliably preclude the malfunction of lateral transistors triggered by electric fields and/or by electrostatic charging of the isolating synthetic resin packaging of components to be tested, in which lateral transistors:

at least one vertical transition from a slightly doped region to a highly doped region; and/or at least one vertical transition from a highly doped region to a slightly doped region takes place.

A further advantage of the invention resides in that the arranging of the additional, i.e. second field plate (=on the side of the silicon substrate facing away from the isolating layer, in the area of the component, particularly in the area of the slightly doped zone of the component, in particular the planar metallization region) enables the electric field to be defined on both sides of the slightly doped component.

This defining of the electric field is of essential importance to the invention in so far as, as a result of the SOI application on an isolating layer instead on bulk silicon, the threshold voltage on the side face of the slightly doped zone of the component facing the buried oxide (passivation) layer must be controlled to preclude the formation of a conductive channel that short-circuits both highly doped regions of the component with each other and hence to preclude a malfunction of the component.

The additionally introduced (second) field plate thus shields the slightly doped zone(s) of the component from undefined electric fields which may be caused by electrostatic charging of an encapsulating packaging of integrated circuits.

As discussed in detail hereinabove, the teachings of the invention can be advantageously embodied and refined in various ways. For this purpose, on the one hand, reference is made to the claims subsequent to claims 1 and 6 and, on the other hand, further embodiments, features and advantages of the invention are explained in greater detail with reference to the example illustrated with FIG. 1.

In the drawing:

FIG. 1 is a diagrammatic cross-sectional view of an exemplary embodiment of a semiconductor device in accordance with the invention manufactured according to a method in accordance with the invention.

As shown in FIG. 1 by means of an exemplary embodiment, the invention provides a semiconductor device in the form of a S[ilicon]O[n]I[nsulator] device 100 comprising, inter alia, an isolating layer 10 made of a dielectric material as well as a silicon substrate 20 arranged on said insulating layer 10. A component in the form of a bipolar pnp transistor 30 is integrated in this silicon substrate 20, which component has in its central area a slightly doped zone in the form of an n-doped region 34 and in each of the two lateral areas a highly doped zone in the form of a p-doped region 32 and 36, respectively. As shown in FIG. 1, the silicon substrate 20 comprising the component 30 is fixed onto the isolating layer 10 by means of a fixing medium in the form of an adhesive layer 12.

Between the isolating layer 10 and the n-doped region 34 of the pnp transistor 30, a planar first metallization region in the form of a first field plate 40 is formed which is used as a wiring level of the pnp transistor 30; this first field plate 40 is embedded in an oxide-based, first passivation layer 22 and does not only constitute an electrode associated with the pnp transistor 30 but also serves to shield this pnp transistor 30 from undesirable electrostatic charges and the resultant electric fields, such as they occur, for example, through the synthetic resin packaging material of such components.

In order to be able to define and establish the potential ratios not only on the lower side of the pnp transistor 30 shown in FIG. 1 but also on the upper side of the pnp transistor 30 shown in FIG. 1 so as to ensure trouble-free operation of the pnp transistor 30 as well as of the related integrated circuit (=IC=integrated circuit), a likewise planar, second metallization region in the form of a second field plate 42 is arranged on the side of the silicon substrate 20 facing away from the isolating layer 10, in the area of the n-doped region 34 of the pnp transistor 30.

Said additional, i.e. second, field plate 42 thus enables the electric field on both sides of the pnp transistor 30 to be defined. This defining of the electric field is important in so far as, as a result of the SOI application on the isolating layer instead on bulk silicon, the threshold voltage on the side face of the n-doped region 34 of the pnp transistor 30 facing a buried oxide (passivation) layer 26 can be controlled in order to preclude the formation of a conductive channel that short-circuits the two p-doped regions 32, 36 of the pnp transistor 30 with each other and hence to preclude a malfunction of said pnp transistor 30.

The additionally incorporated second field plate 42 thus shields the slightly doped n zone 34 of the pnp-transistor 30 from undefined electric fields such as they may be caused by electrostatic charging of an encapsulating packaging of integrated circuits.

As is also shown in FIG. 1, the above-mentioned buried, second passivation layer 26 is arranged between the pnp transistor 30 and the second metallization region 42 (=second field plate 42), and, on the side of the pnp transistor 30 facing the isolating layer 10, an oxide layer 24 borders on the pnp transistor 30 and on the buried second passivation layer 26; this means that the first metallization region in the form of the first field plate 40 is situated between the first passivation layer 22 and the oxide layer 24.

Summarizing, it can be said that the (second) metallization 42 provided after the transfer of a SOI process onto an insulator can be used as an additional (second) electrode to electrically/electrostatically shield, on both sides, the partially slightly doped component 30.

LIST OF REFERENCE NUMERALS 100 semiconductor device, in particular S[ilicon]O[n]I[nsulator] device
10 isolating layer
12 fixing means, in particular adhesive layer
20 silicon substrate
22 first passivation layer
24 oxide layer
26 second, in particular buried, passivation layer
30 component, in particular pnp transistor
32 first, highly doped zone, in particular first p-doped region, of the component 30
34 slightly doped zone, in particular n-doped region, of the component 30
36 second, highly doped zone, in particular second p-doped region, of the component 30
40 first metallization region, in particular first field plate
42 second metallization region, in particular second field plate

The invention claimed is:

1. A Silicon on Insulator (SOI) device, comprising:
   at least one isolating layer made of a dielectric material
   at least one silicon substrate arranged on said isolating layer and having a buried passivation layer, which is in particular oxide-based;
   at least one component integrated in the silicon substrate, which component has at least one slightly doped zone, and is a lateral transistor, as well as
   at least a first, in particular planar, metallization region arranged between the isolating layer and the component, and
   at least a second, in particular planar, metallization region arranged on the side of the silicon substrate facing away from the isolating layer, in the area of the component, on the buried passivation layer of the substrate, wherein
      a first field plate is defined in the first metallization region in the area between the isolating layer and the slightly doped zone of the component, and
      a second field plate is defined in the second metallization region in the area of the slightly doped zone of the component.

2. An SOI device as claimed in claim 1, wherein the lateral transistor is a bipolar pnp transistor, and its slightly doped zone is formed by the n-doped region of the pnp transistor.

3. An SOI device as claimed in claim 2, wherein the first field plate is embedded in an oxide-based, first passivation layer.

4. An SOI device as claimed in claim 2, wherein the pnp transistor is part of an integrated circuit.

5. An SOI device as claimed in claim 1, wherein the first field plate is embedded in an oxide-based, first passivation layer.

6. A method of manufacturing a semiconductor device, wherein:
- at least one component having at least one slightly doped zone is integrated in a silicon substrate that is provided with a buried oxide-based passivation layer;
- at least a first, in particular planar, metallization region is arranged between the isolating layer and the component,
- at least one isolating layer made of a dielectric material is provided onto the silicon substrate using, in particular, adhesive means, so as to transfer the SOI-device onto the isolating layer, and
- a second, in particular planar, metallization region is provided on the side of the silicon substrate facing away from the isolating layer, in the area of the component, on the oxide-based buried passivation layer of the substrate, wherein
- the component is a lateral transistor;
- a first field plate is defined in the first metallization region in the area between the isolating layer and the slightly doped zone of the component, and
- a second field plate is defined in the second metallization region in the area of the slightly doped zone of the component.

* * * * *